United States Patent [19]

Jones et al.

[11] Patent Number: 5,526,517
[45] Date of Patent: Jun. 11, 1996

[54] CONCURRENTLY OPERATING DESIGN TOOLS IN AN ELECTRONIC COMPUTER AIDED DESIGN SYSTEM

[75] Inventors: Edwin Jones, Sunnyvale; Soon Kong, San Jose; Asgeir Th. Eirikkson, Los Gatos, all of Calif.

[73] Assignee: LSI Logic Corporation, Milpitas, Calif.

[21] Appl. No.: 883,860

[22] Filed: May 15, 1992

[51] Int. Cl.⁶ .................................................. G06F 17/30
[52] U.S. Cl. ........................... 395/600; 395/650; 364/489
[58] Field of Search .................................. 395/600, 650; 364/489

[56] References Cited

U.S. PATENT DOCUMENTS

| | | | |
|---|---|---|---|
| T940,008 | 11/1975 | Oden | 444/1 |
| T940,020 | 11/1975 | Brechling et al. | 444/1 |
| 4,353,117 | 10/1982 | Spellmann | 364/488 |
| 4,587,625 | 5/1986 | Marino, Jr. et al. | 364/578 |
| 4,635,208 | 1/1987 | Coleby et al. | 364/491 |
| 4,675,832 | 6/1987 | Robinson et al. | 395/141 |
| 4,697,241 | 9/1987 | Lavi | 364/488 |
| 4,703,435 | 10/1987 | Darringer et al. | 364/489 |
| 4,789,944 | 12/1988 | Wada et al. | 364/488 |
| 4,805,113 | 2/1989 | Ishii et al. | 364/491 |
| 4,813,013 | 3/1989 | Dunn | 395/159 |
| 4,827,427 | 5/1989 | Hyduke | 364/489 |
| 4,831,543 | 5/1989 | Mastellone | 364/489 |
| 4,833,619 | 5/1989 | Shimizu et al. | 364/489 |
| 4,890,238 | 12/1989 | Klein et al. | 364/491 |
| 4,908,772 | 3/1990 | Chi | 364/491 |
| 4,918,614 | 4/1990 | Modarres et al. | 364/490 |
| 4,922,432 | 5/1990 | Kobayashi et al. | 364/490 |
| 4,965,741 | 10/1990 | Winchell et al. | 395/12 |
| 4,967,367 | 10/1990 | Piednoir | 364/489 |
| 4,970,664 | 11/1990 | Kaiser et al. | 395/160 |
| 5,005,136 | 4/1991 | Van Berkel et al. | 364/490 |
| 5,034,899 | 7/1991 | Schult | 395/141 |
| 5,084,824 | 1/1992 | Lam et al. | 364/490 |
| 5,111,413 | 5/1992 | Lazansky et al. | 364/578 |
| 5,164,908 | 11/1992 | Igarashi | 364/491 |

FOREIGN PATENT DOCUMENTS

| | | | |
|---|---|---|---|
| 0463301A2 | 1/1992 | European Pat. Off. | 15/60 |

OTHER PUBLICATIONS

"Quality Of Designs From An Automatic Logic Generator (ALERT)", by Friedman et al., IEEE Design Automation Conference, 1970, pp. 71–80.

"Switch–Level Delay Models For Digital MOS VLSI", by Ousterhout, IEEE 21st Design Automation Conference, 1984, pp. 542–548.

"Tango–Schematic Capture Software", PERX Catalog, pp. 18 & 19.

"Methods Used in an Automatic Logic Design Generator (ALERT)", by Friedman et al., IEEE Transactions On Computers, vol. C18, No. 7, Jul. 1969, pp. 593–614.

"An Efficient Heuristic Procedure for Partitioning Graphs", by Kernighan et al., The Bell System Technical Journal, Feb. 1970, pp. 291–306.

"Design Automation", by Russo, Computer, May/Jun. 1972, pp. 19–22.

"Computer Aided Design", by Lynn, Computer, May/Jun. 1972, pp. 36–45.

"Recent Developments in Design Automation", by Breuer, Computer, May/Jun. 1972, pp. 23–35.

"LINDA: A Local Interactive Design Aid For Comput (List continued on next page.)

Primary Examiner—Thomas G. Black
Assistant Examiner—Peter Y. Wang
Attorney, Agent, or Firm—Carr, DeFilippo & Ferrell

[57] ABSTRACT

An Electronic Computer Aided Design System provides for concurrent operation of a plurality of design tools which share a common design dataset. Changes made by one program to the design dataset are immediately updated and are automatically reflected in the displayed outputs of the other design tools. A tool manager program allows rule-based automation of the entire system.

8 Claims, 5 Drawing Sheets

OTHER PUBLICATIONS er-Aided General-Purpose Artwork Production", by Briggs, GEC Journal of Science & Technology, vol. 43, No. 2, 1976.

"An Engineering System for Designer, Manager and Manufacturer", by Smith et al., Telesis, vol. 4, No. 9, Dec. 1976, pp. 268–273.

"Computer Graphics In Power Plant Design", by Strong et al., IEEE Power Engineering Society, Jul. 1978.

"An Automated System to Support Design Analysis", By Willis, 12th Annual Asilomar Conference on Circuits, Systems & Computers, IEEE, Nov. 1978. pp. 646–650.

"Computer-Aided Partitioning of Behavioral Hardware Descriptions", by McFarland, 20th Design Automation Conference, IEEE, 1983, pp. 472–478.

"Definite Clause Translation Grammars", by Abramson, University of British Columbia, IEEE, 1984, pp. 233–240.

"VERIFY: A Program for Proving Correctness of Digital Hardware Designs", by Barrow, Artificial Intelligence 24, 1984, pp. 437–483.

"Automated Generation of Digital System Schematic Diagrmas", by Arya et al., 22nd Design Automation Conference, IEEE, 1985, pp. 388–395.

"Using Bottom-Up Design Techniques in the Synthesis of Digital Hardware from Abstract Behavioral Descriptions", by McFarland, 23rd Design Automation Conference, IEEE, 1986, pp. 474–480.

"Partitioning Before Logic Synthesis", by Camposano et al., IBM Thomas J. Watson Research Center, IEEE, 1987, pp. 324–326.

"Partitioning and Placement Technique for CMOS Gate Arrays", by Odawara et al., IEEE Transactions on Computer-Aided Design, vol. CAD-6, No. 3, May 1987, pp. 355–363.

"Partitioning a Design in Structural Synthesis", by Camposano et al., IBM Watson Research Center, IEEE, 1987, pp. 564–566.

"The System Architect's Workbench", by Thomas et al., 1988 DAC Draft Submission, Nov. 1987.

"Formal Verification of Digital Circuits Using Hybrid Simulation", by Srinivas et al., IEEE Circuits and Devices Magazine, Jan. 1988, pp. 19–26.

"Tektronix Design Automation Products", 1988. pp. 83–90.

"Formal Verification of the Sobel Image Processing Chip", by Narendran et al., 25th ACM/IEEE Design Automation Conference, 1988, pp. 211–217.

"Chip Simulation Is All A Matter of Image", by Thacker et al., ESD: The Electronic System Design Magazine, Nov. 1988, pp. 65–70.

"Area-Time Model for Synthesis of Non-Pipelined Designs", by Jain et al., CH2657-5 1988 IEEE, pp. 48–51.

"CAD For System Design: Is It Practical?", IEEE Design & Test of Computers, Apr. 1989, pp. 46–55.

"Acrhitectural Partitioning for System Level Design", by Lagnese et al., 26th ACM/IEEE Design Automation Conference, 1989, pp. 62–67.

"Here's Software To Speed Vector Creation", by Beaverton, Electronics, May 1989, pp. 48–52.

"Here's An Easy Way To Test ASICs", by McLeod, Electronics, May 1989, pp. 116–117.

"Experience with the ADAM Synthesis System", by Jain et al., 26th ACM/IEEE Design Automation Conference, 1989, pp. 56–61.

"Chippe: A System for Constraint Driven Behavioral Synthesis", by Brewer et al., IEEE Transactions on Computer-Aided Design, vol. 9, No. 7, Jul. 1990, pp. 681–695.

"BAD: Behavioral Area-Delay Predictor", by Kucukcakar et al., CEng Technical Report 90-31, Nov. 1990.

"HYPER-LP: A System for Power Minimization Using Architectural Transformations", by Chandrakasan et al., IEEE, 1992, pp. 300–303.

PRIOR ART

CONCURRENTLY OPERATING DESIGN TOOLS IN AN ELECTRONIC COMPUTER AIDED DESIGN SYSTEM

TECHNICAL FIELD OF THE INVENTION

The invention relates to computer-aided design systems, and in particular to computer aided electronic design systems which facilitate the design, simulation and layout of integrated circuit chips.

BACKGROUND OF THE INVENTION

Integrated circuit technology has provided a basis for the design of increasingly miniaturized systems, often providing capabilities impossible or impractical on a larger scale. As technology has progressed, the need for ever smaller, ever more complex systems has grown, requiring greater and greater density of integrated circuit technology. As the geometries of integrated circuit devices shrink and the capability to provide more function on a single integrated circuit grows, the need arises to provide designers with tools to facilitate the design of more complicated integrated circuit chips. This capability is provided by computer aided design systems.

Integrated circuits are often designed by the designer in a modular fashion. The designer breaks up the design into small, manageable pieces and captures each such piece as a module. A completed design may comprise many such modules, and modules may further comprise other modules, etc. This "nested" modular approach is particularly useful when a design is highly repetitive, since a relatively simple module may be designed and debugged, then replicated many times. This allows both a high degree of confidence in the finished design and a relatively low level of effort required to complete it.

Computer-aided design systems, hereinafter referred to as CAD systems, are well known in the present art. Such systems are in wide use in a number of engineering disciplines for the purpose of facilitating the design of such things as: electronic circuits and circuit boards (electronic CAD, or ECAD systems), mechanical systems (mechanical CAD, or MCAD systems), software (computer-aided software engineering, or CASE), and integrated circuits (also known as ECAD systems). Of particular relevance to the present invention are those ECAD systems used to design, simulate and layout integrated circuit chips.

ECAD systems of this type have been in use for many years. Specific examples of such systems include ECAD systems provided by Mentor Graphics, Inc. of Beaverton, Oreg., Valid Logic Systems of Mountain View, Calif., and LSI Logic Corp. of Milpitas, Calif., among others. In all cases, these ECAD systems comprise a set of software tools running on a computer-based workstation.

Typically, such tools include a schematic editor, a circuit compiler, a linker, a simulator, and layout tools. The normal flow of operation is "serial" in that the designer runs the schematic editor to create a design, which is stored in a design dataset. Then the designer exits the editor and runs a compiler which processes the design dataset producing another design dataset. This is then "linked" which produces yet another design dataset, and so on.

An example of such software tools is given by the MDE (Modular Design Environment) system produced by LSI Logic Corp. of Milpitas Calif. This system runs on a Sun Microsystems workstation, running the UNIX operating system and the SUNVIEW windowed graphical user interface, and includes a schematic editor (LSED), compiler, linker, logic simulator (LSIM), layout editor, bonding editor, floorplanning utility, and design rule checker.

This serial mode of operation is depicted in FIGS. 1 and 2. In FIG. 1, an input dataset (Design Dataset A) is operated on by Program A to produce another dataset (Design Dataset B). This new dataset is then operated upon by Program B to produce another design dataset (Design Dataset C), and so forth. FIG. 2 shows serial operation of a number of Processes (A, B, C, D).

Because of the serial nature of the dataset production, sometimes referred to as "batch processing" or "batch-mode", any program which produces a dataset must run to completion before another program may operate on its output. As a result of this mode of operation, a great deal of time is spent loading programs and moving data in and out of memory. This process can be quite time consuming, especially as designs grow in complexity.

Designers spend most of their integrated circuit design time engaged in a process which has become known as an "edit-compile-simulate" loop. This process involves creating and/or modifying one or more schematic diagrams with a schematic editor, compiling and linking the newly entered/modified design, and then running a simulator to determine whether or not the new design will perform as expected. If not, as is often the case, or if there are some enhancements or improvements to be made, the designer will return to the start of the process; re-editing, re-compiling and re-simulating repetitively until he is satisfied that the design performs as expected.

Another reason designers spend a great deal of time in the "edit-compile-simulate" loop is that many designers will test a design incrementally as it is created by simulating any previously design work along with some new design work. In this manner, confidence in the design is established in small steps, requiring a great deal less effort and insight at any given time than trying to test (and debug) a large design all at once. A designer or group of designers may make many cycles through this process before completing a design.

Because of the repetitive nature of the design actions taken in creating an integrated circuit design, any reduction in the amount of time required to perform any of these repeated steps will reduce the total design time by an amount as many times greater than the time savings as the number of cycles through the edit-compile-simulate process experienced by the designer.

Recently, some steps have been taken to improve the speed of ECAD systems in their time-consuming and repetitive operations. Some such steps include the design of faster, more efficient batch-mode compilers and linkers.

An example of such an improvement is incremental compilation, whereby only portions of a design which have been modified are compiled, eliminating a large portion of the data transfer and computing load required to process a modified design.

While incremental compilation provides significant time advantages over batch-mode compilation for small changes involving only one or a few modules in a large design, batch-mode compilation can be faster when design changes are extensive, or for initial compilation of a large design. As a result, any system which relies exclusively on either technique pays a penalty when the extent of design changes indicate that the other technique would be more appropriate.

Another common weakness in many present ECAD systems is that the design process is divided into two relatively isolated processes: design and layout. The design part of the process involves schematic capture, compilation, and linking as described previously herein; while the layout part involves layout floorplanning, component placement, signal routing, analysis of the layout for parameters such as parasitic capacitance, and back-annotation of the original design with information derived during the layout process. After the layout, the designer will likely re-simulate for the purpose of locating any layout-induced problems. If there are any, the edit-compile-simulate process will be repeated, this time extending the process to include layout. Because of the relative isolation of the layout process from the rest of the design process, layout is also performed serially, often being performed using software tools (programs) having user interfaces which bear little or no resemblance to those of the software tools used during the design process. An example of a floorplanner is found in commonly-owned U.S. Pat. No. 4,918,614, entitled HIERARCHICAL FLOORPLANNER, issued on Apr. 17, 1990 to Modarres, Raam and Lai.

Much of the design process is repetitive or predictable. The designer makes changes to a circuit design, then compiles, links, simulates, etc. This process usually requires the designer to run the same programs and provide them with the same or similar inputs over and over. This process of manually running programs and re-entering input parameters, re-executing processes which have already been performed before and which have already provided much the same results, etc., can be quite time-consuming.

DISCLOSURE OF THE INVENTION

It is therefore an object of the present invention to provide a technique for operating a number of design tools (programs) on an CAD system simultaneously, in such a manner that they share information.

It is a further object of the present invention to accomplish the above in a manner such that when changes are made to a design by one program, other programs are notified of the changes and reflect those changes automatically.

It is a further object of the present invention to provide a means of automating the process of executing repetitive design operations.

These objects are accomplished in part by providing an ECAD system with design tools (programs), such as schematic editor, simulator, linker, compiler, layout tools, etc., which operate from a shared design dataset and which communicate through the use of messages tagged with a message class identifier. Access to this shared dataset is governed by a data manager through which all requests for access to the shared dataset are made. Any program which needs to communicate information to any other program does so by tagging information with a class identifier which associates it with a type of information. Programs may register requests to receive information associated only with certain classes. A communication manager maintains a list of programs to which messages of any given class must be sent and delivers them accordingly.

By operating from a shared dataset, many operations can be performed in parallel. Design tools need not be operated in a serial fashion. For example, layout may be in process while circuit simulation is going on. This communication scheme allows a schematic editor to send messages associated with net-list changes along with a class identifier which identifies them as such. Other programs, such as a simulator may receive this information and recognize that it is necessary to re-examine the shared dataset for changes and to re-simulate. In this way, changes made in the schematic editor are rapidly and automatically reflected in the simulation results. Of course, the same technique may be used between any two programs which share common data, for example: the layout impact of schematic changes may be rapidly and automatically identified.

These objects are further accomplished through the use of an incremental compiler and an incremental linker. By using incremental linking techniques, further speed improvements may be realized over systems using batch mode linking.

Other objects, features and advantages of the present invention will become apparent in light of the following description thereof.

DETAILED DESCRIPTION OF THE INVENTION

A preferred embodiment of the ECAD system of the present invention comprises one or more CAD workstations and software running thereupon. Each CAD workstation comprises at least a computer, memory, display system, and input devices including a keyboard and a mouse or other pointing device. Typically, there will also be one or more mass storage devices such as a disk drive available for program and data storage and retrieval. If more than one workstation is used, then they must be connected by a communication interface which may be a network, a simple communication line, or shared memory. A number of manufacturers produce workstations of this type. One example of such a CAD workstation is the Sun 3/260 workstation (marketed by Sun Microsystems). The software of the preferred embodiment of the present invention comprises a multi-tasking operating system, such as UNIX (marketed by AT&T), a windowed graphical interface such as XWINDOWS (MIT), a communication manager, a data manager, a tool manager, a design compiler, a design linker, and a number of ECAD design programs. Representative design programs of this type may be found in the MDE (Modular Design Environment) development system marketed by LSI Logic Corporation of Milpitas, Calif., with specific examples being the LSIM, LWAVE, Schematic Editor, Floorplanner, Bond Editor, and Layout Editor programs. These programs, however, operate in the serial or "batch" mode of the prior art and require additional capability as detailed in the following description. This additional capability does not alter the overall function of these programs, but certainly changes the way they access data, and provides a "recalculate" capability in the event of an externally generated design change. The internal workings of these design tools other than their method of communication and data access are well known to those skilled in the art and will not be further elaborated upon herein.

Figure 1:
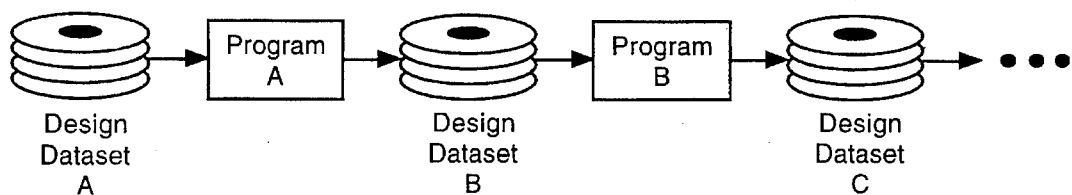
FIG. 1 is a flow diagram indicating the data flow of CAD systems of the prior art.
Figure 2:
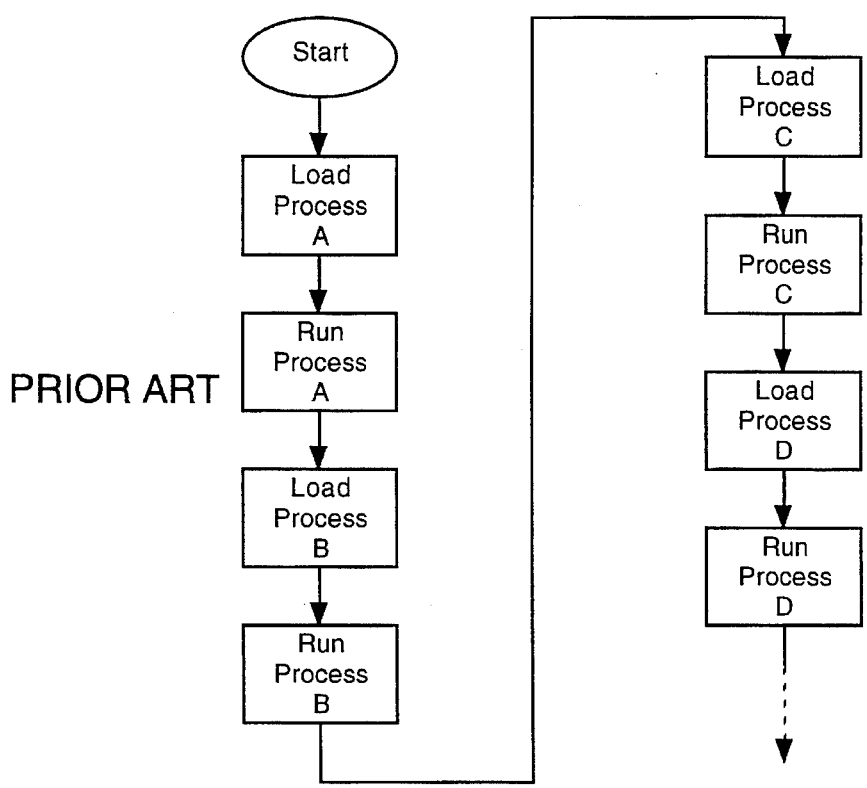
FIG. 2 is a flow diagram indicating the serial nature of operations in CAD systems of the prior art.
Figure 3:
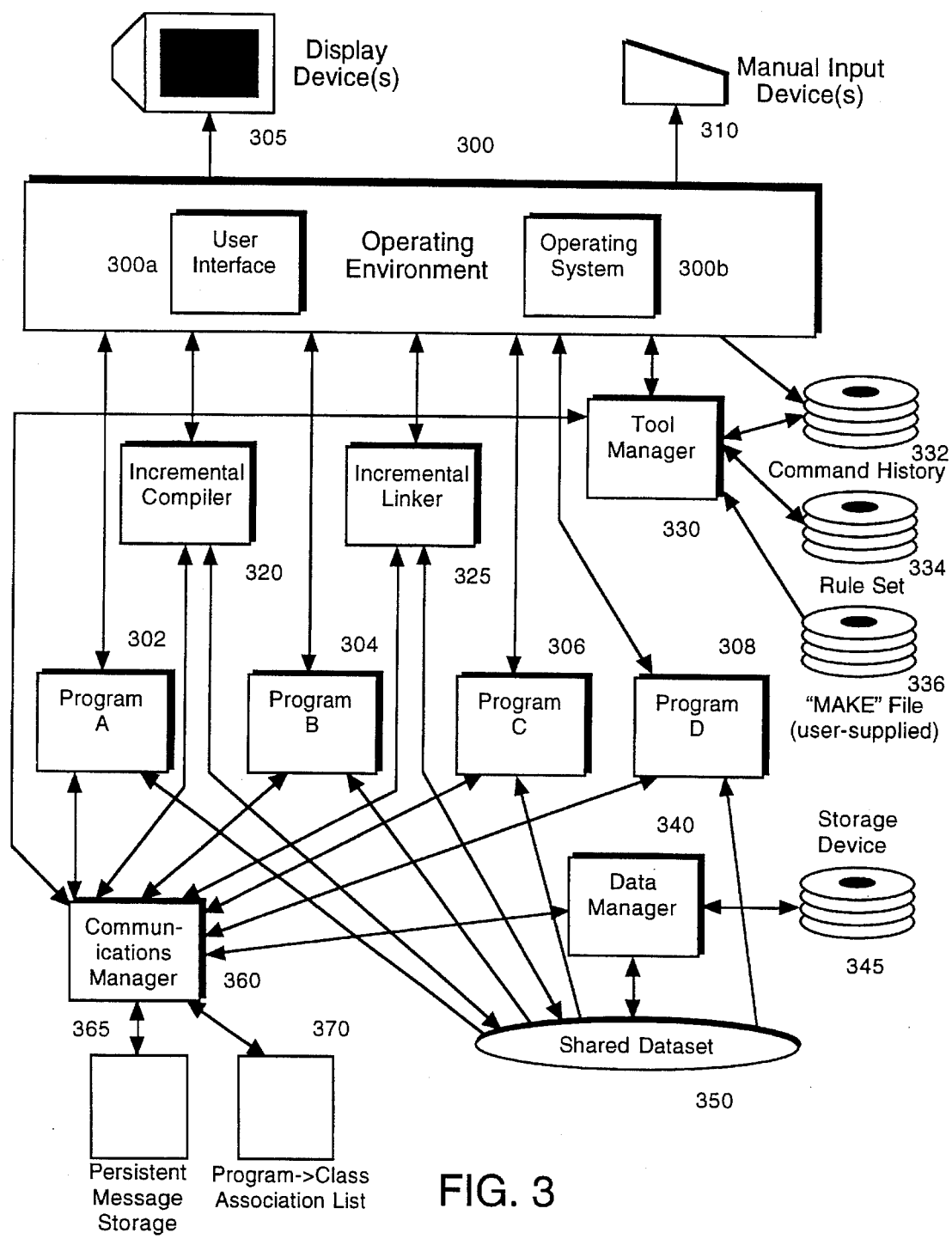
FIG. 3 is a data flow diagram showing the overall structure of the ECAD system of present invention.

Referring to FIG. 3, an operating environment 300 comprising a user interface 300a, such as XWINDOWS and operating system 300b, such as UNIX, provides basic workstation functions such as: system timekeeping, scheduling, memory management, system error handling, device drivers for the control of peripherals including but not limited to display device or devices 305 and manual input device or devices 310, inter-task communications, task creation, task start and stop, task deletion, and the user interface functions of a windowed graphical environment. The ECAD user interacts with the ECAD system via display device(s) 305 and manual input device(s) 310, which operate under the control of the operating environment 300. Any program (task) running within the operating environment (e.g. 302, 304, 306, 308, 320, 325, 330, 360) communicates with the ECAD user (designer) by issuing display requests to and receiving input from the user interface 300a which interprets and formats the requests and input data and makes use of services provided with the operating system 300b to operate the physical display device(s) 305 and manual input device(s) 310. The operating environment 300 also provides the basic services by which tasks (programs) are started and stopped, commands are issued to programs, and messages are communicated between programs. Further, a command history 332 is maintained by operating environment 300 which contains a complete record of all commands issued to all programs running thereupon.

One or more ECAD application programs, of which Programs A, B, C, and D (302, 304, 306, and 308, respectively) are representative, are all simultaneously loaded and running in a CAD workstation's memory. On a system comprising multiple workstations, these programs may be distributed between the workstations. Each program may communicate with the designer via the operating environment 300. Each such program may also send messages to a communication manager 360 and may read data from a shared dataset 350.

An incremental compiler 320 and an incremental linker 325 are also loaded and ready to run on the ECAD system. Like any other ECAD program, they have access to the user interface 300a, operating system 300b, communication manager 360 and shared dataset 350. These two programs 320, 325 compile and link design data in shared dataset 350.

A communication manager program 360 provides a mechanism by which a program may send messages which will be received by other programs without needing to know the names, identities, or even the existence of other programs running concurrently with it. This is accomplished by requiring message-sending programs to put a class identifier in each message. This class identifier denotes the type of information contained in the message. The message is then sent to the communication manager 360 by services provided in the operating environment 300. Any programs running on the system may register requests with the communication manager to receive any and all messages belonging to one or more message classes. When the communication manager receives such a request, it places the name or identification of the requesting program in a list 370 of programs to which to forward messages of the class(es) for which the program is registering a request. When the communication manager receives a message from any program, it looks up in list 370 the names or identifiers of those programs which have previously registered requests to receive messages belonging to the class identified in the message. The communication manager 360 then forwards the message to all of those programs via services provided in operating environment 300.

A message may be important enough, by virtue of its content, that a sending program will require that it be retained permanently. This is accomplished by placing an indicator in the message identifying it as a "persistent message". When the communication manager receives such a message, it forwards it in normal fashion, but also retains a copy of the message in a persistent message storage buffer 365. When any program registers a request to receive messages belonging to a message class, it will immediately be forwarded those messages in the persistent message storage buffer 365 which belong to that class.

A data manager 340 governs access rights to shared dataset 350. When a program starts up, or when it requires access to part or all of the shared dataset 350, it makes a request to the data manager for read-only access rights. If the requested portion of the shared dataset is not undergoing modification (i.e., if write-access right have not been granted by the data manager) then read-only access is granted. The program may then freely read the shared dataset 350, but may not modify it. The data manager 340 will also have access to a mass storage device 345 containing permanent copies of design data. When a new design is to be accessed, the data manager 340 loads the permanent copy of the requested design data on mass storage device 345 into the shared dataset 350. This mass storage device 345 may be resident on the CAD workstation on which the data manager is running, or it may be accessible as a remote device. In either case, operating system 300b provides either network or communications access to a remote device, or local access to a local device in a compatible manner. It will not matter to the data manager 340 whether the mass storage device 345 is local or not.

A tool manager 330 is also running on the ECAD system of the present invention. It has access to operating environment 300 and to command history 332, a rule set 334, and a "MAKE" file 336. The MAKE file 336 is user-provided and identifies all information about a design, its module structure, and what programs must be run to process it. The tool manager 330 issues commands to ECAD system programs to operate on data in the shared dataset 350 based upon explicit requests by the designer, based upon design rules contained in rule set 334, based upon information contained in the command history buffer 332, and/or in MAKE file 336.

Incremental compilation is known in the present art and has been incorporated into systems marketed by Mentor Graphics, Inc. of Beaverton, Oreg. and Valid Logic Systems of Mountain View, Calif.

Figure 4:
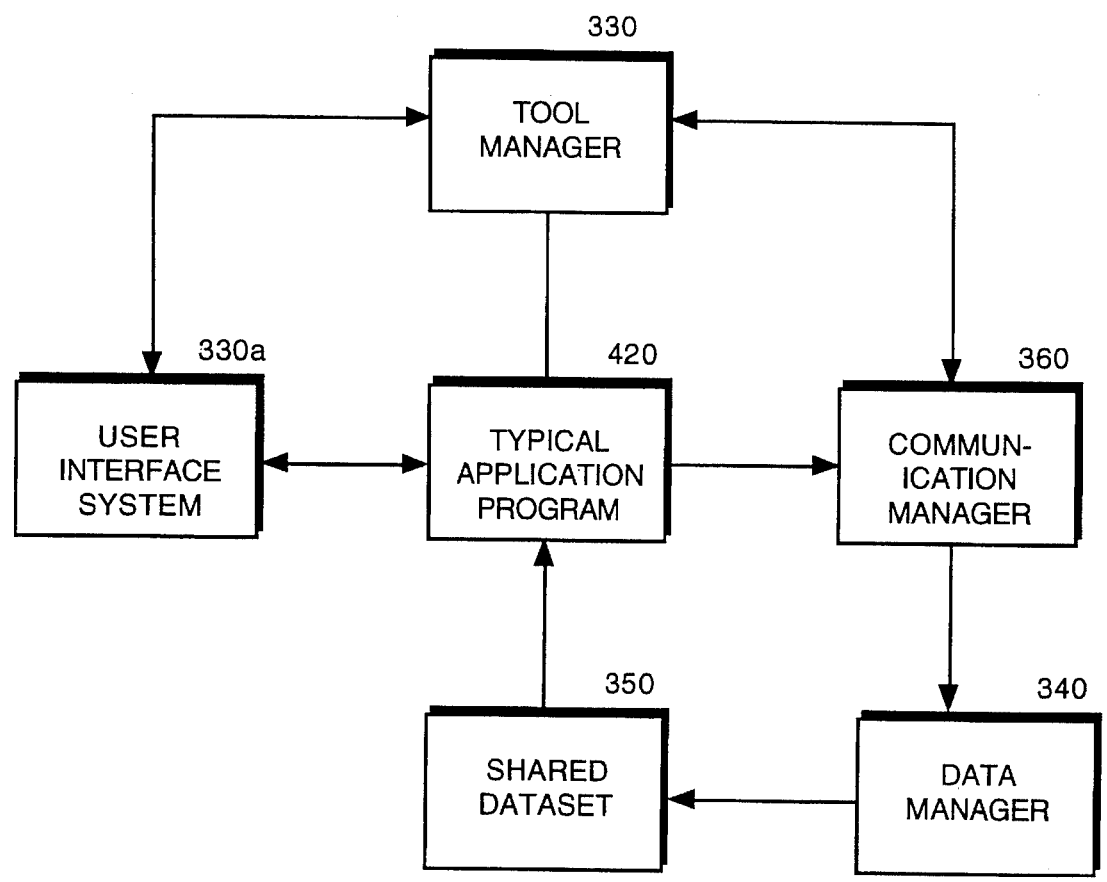
FIG. 4 is a data flow diagram showing typical design data flow for the ECAD system of the present invention.

Referring to FIG. 4, the "usual" design data flow is as follows: a typical application program 420 (analogous to Programs A 302, Program B 304, Program C 306, and Program D 308 with respect to FIG. 3) operates upon data in shared dataset 350. Any changes to shared dataset 350 required by program 420 are requested of the data manager 340 via the communication manager 360. Data manager 340 applies these changes to shared dataset 350. Program 420 communicates with the ECAD system user via user interface 300a. On top of this structure is the tool manager 330 which communicates with the ECAD system user via user interface 300a, issues commands to program 420, and sends and receives messages via the communication manager 360.

Design tools (programs) written for the ECAD system of the present invention operate in substantially the same manner as similar design tools written for any other ECAD system, except in the way they access design data which is shared in common with other programs. It should be noted that practical formats for common data structures for electronic design interchange are widely known in the present art, notably the EDIF (electronic design interchange format) and EDIF II standards, and need not be elaborated upon herein. The specific format of common data is not of particular import to the present invention.

Programs may use local datasets freely for internal purposes, but all design data is stored in the shared dataset. When design data is required, programs must request access rights to that portion of the shared dataset from the data manager. A program will be granted "read" access unless a change is in progress in that area of the shared dataset to which that program has requested access. In this case, the program is stalled by the data manager until the change is complete, and then "read" access rights are granted. The data manager keeps track of all programs which have requested and been given access to the shared dataset and the areas of the dataset to which they have been given access. If a program needs to make a change to the common data, the program requests "write" access to a portion of the shared dataset, the data manager notifies all programs known to have access to the shared dataset to release those write access rights. These programs then either release the shared dataset and suspend operation, or copy the portion of the dataset they are using into a local buffer, release the dataset, and resume operation with a local copy of the data.

When all accessing programs have released the affected portion of the shared dataset, the data manager notifies the program requesting "write" access that access is granted. The program then makes any necessary changes, releases the affected portion of the shared dataset and notifies the data manager of the completed change and the extent thereof. The data manager then notifies all programs which previously had "read" access rights that "read" access is once again granted and that a change has occurred. These programs then read the affected portion of the shared dataset and operate upon it as if seeing it for the first time. Because it is not necessary to modify the entire shared dataset at once, the extent of changes made in any one step may be minimized and may be performed incrementally.

Communication Manager (360)

The purpose of the communication system (manager) is to enable programs to interchange information without prearrangement of identities of the sender and receiver. This communication system allows programs to be added to the system without modifying existing portions of the ECAD system. It also provides a uniform mechanism for programs to exchange information.

A detailed discussion may be found in a document entitled MDE Communications Subsystem.

Figure 5:
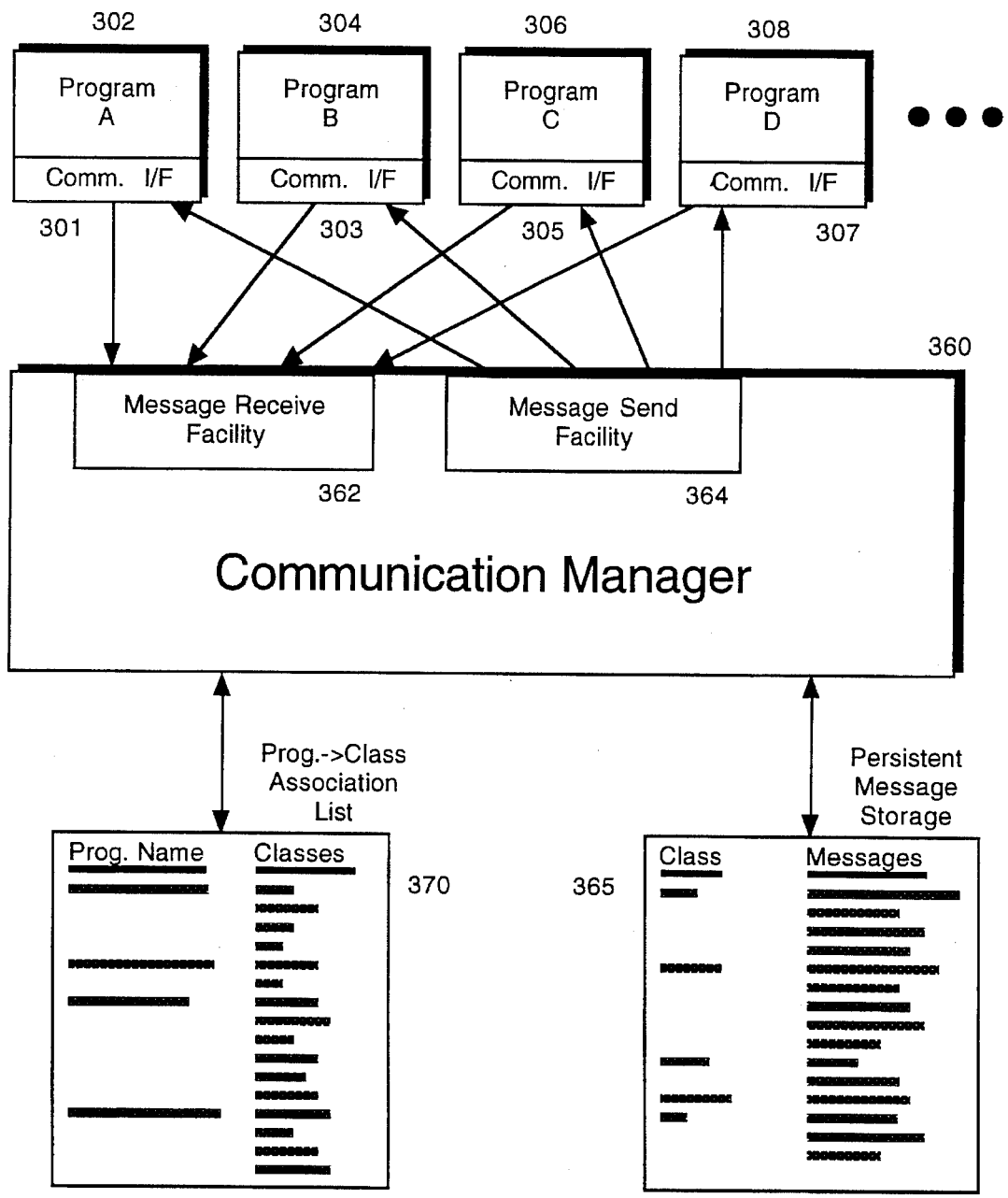
FIG. 5 is a data flow diagram showing the operation of the communication manager of the present invention.

Referring to FIG. 5, the communication manager 360 receives from and sends messages to programs A, B, C, and D, (302, 304, 306, and 308, respectively) via a message receive facility 362 and a message send facility 364. These programs (302 .. 308) are representative of any design tools running on the ECAD system of the present invention and may include such functions as a schematic editor, a batch compiler, an incremental compiler, a batch linker, an incremental linker, a logic simulator, a layout floorplanner, a signal routing tool, etc. In the preferred embodiment, all of the aforementioned programs are included. Such software tools are widely known in the present art and will not be elaborated upon herein except where they differ significantly from existing software tools of the same type.

All messages are tagged with a message class by the sending program. Programs 302, 304, 306, and 308, each have a communication interface ("Comm. I/F"), 301, 303, 305, and 307, respectively, which enables them to send and receive messages via the communication manager. These programs are arbitrarily named tasks (design tools) running on the ECAD system of the present invention and have unspecified functions for the purposes of illustration, but could represent a schematic editor, a layout floorplanner, and a wire routing tool; or any other reasonable combination of CAD programs. These arbitrarily named programs will be used for illustration purposes in the ensuing description.

At initialization time, and at any time thereafter, each program in the system informs the communication manager of which message class(es) it wishes to receive. In general, these classes are established on a "need to know" basis, i.e., each class is associated with a certain group of operations or a certain dataset. Programs register interest in receiving messages associated only with those classes for which there is a need. When the communication manager receives a request from a program to receive messages from a certain class, it makes an entry in a Program-to-Class association list 370 which associates program names (or ID's or whatever mechanism is used to identify programs) with the message classes they wish to receive. For example, a simulator would have a need to know of any changes in a net-list dataset shared with a schematic editor, and would register a request to receive all messages tagged with a class associated with net-list changes.

An initial pre-defined set of classes and message formats forms the basis of a command and communication control language. The command and communication command language provides a common format of information exchange over the communication manager system. If a common language is not established, each communication message format and content would be the result of a negotiation between the authors of the sending and receiving programs. Each message has both a type and a class.

By way of example, the command and communication control language may suitably have four basic message types. These are as follows:

1) equate-define: This statement type is used to equate names or actions. Variable names in an program may be equated to a string of function calls. Equation of one variable to another may involve an equation or a procedure to transform a value, modify a name, or calculate a pointer address.

2) inform-set: This statement type is used to inform programs of values of variables or names of objects. Set statements may be used to define the value of function arguments. Before this statement can be understood, a program must have defined its variable names for the communication system.

3) command-order: This statement type tells a program to perform a specified action.

4) query-request: This statement type requests that a program send an inform type message containing the requested data.

The communication system learns of the specifics of programs from an initialization phase when definitions are loaded from the program. These definitions map actions onto function names and data names onto the function arguments.

Preferably, the communication system is intended to communicate short commands via messages, not large blocks of data. An example of such a message is notification that a net (signal) has been selected in one window so that its state can be displayed in another window. On the other hand, the description of a change in the design will not be sent over the communication system. Instead, a message will be sent saying that a change has occurred, but the description of the actual change will be transferred by other means.

Since destinations of messages are not specified and an individual program is not interested in all of the message traffic, another addressing scheme is required. A system of message classes is established. When a program has a need for information that it cannot satisfy for itself or has information which is needed by other programs, it composes a message. The communication system then transmits the message to the programs which have expressed an interest in this message class. After examining the message, the receiving program may either 1) perform a required action, 2) store the information, or 3) ignore the message as not being of interest to the receiving program after all.

Programs may register interest in a message class with the communication manager at any time. Therefore, a program can elect to receive both pre-established message classes and new classes which it learns of over the message system.

Although not critical to the invention, messages may be assigned a priority which will determine the order in which the messages are sent to the receiving programs. Messages of all classes for a receiving program will be delivered one at a time. When the receiving program is available to receive a message, the message having the lowest priority number in the queue for that program will be delivered. A program may require some time to process a message and will be unavailable to receive other messages during this time; therefore, the message send facility 364 has the capability to send a high-priority message to a receiving program at any time which will interrupt the receiving program's normal flow of processing and force the message to be acted upon. These "emergency" messages will be shutdown commands, commands to halt processing, or notifications of other such emergency conditions.

Because programs will start at different times in a random order, some messages may be sent before a program which must receive the message has registered interest. To solve this difficulty, some messages may be marked as persistent. These messages are kept by the communication manager in Persistent Message Storage 365, and are sent to all programs which register interest for that message class at any time thereafter.

Data Manager (340)

One of the primary objects of the present invention is to keep multiple programs loaded at all times with current design information available to all the programs simultaneously. This simultaneous availability is achieved by a data manager system which manages all common design data.

Figure 6:
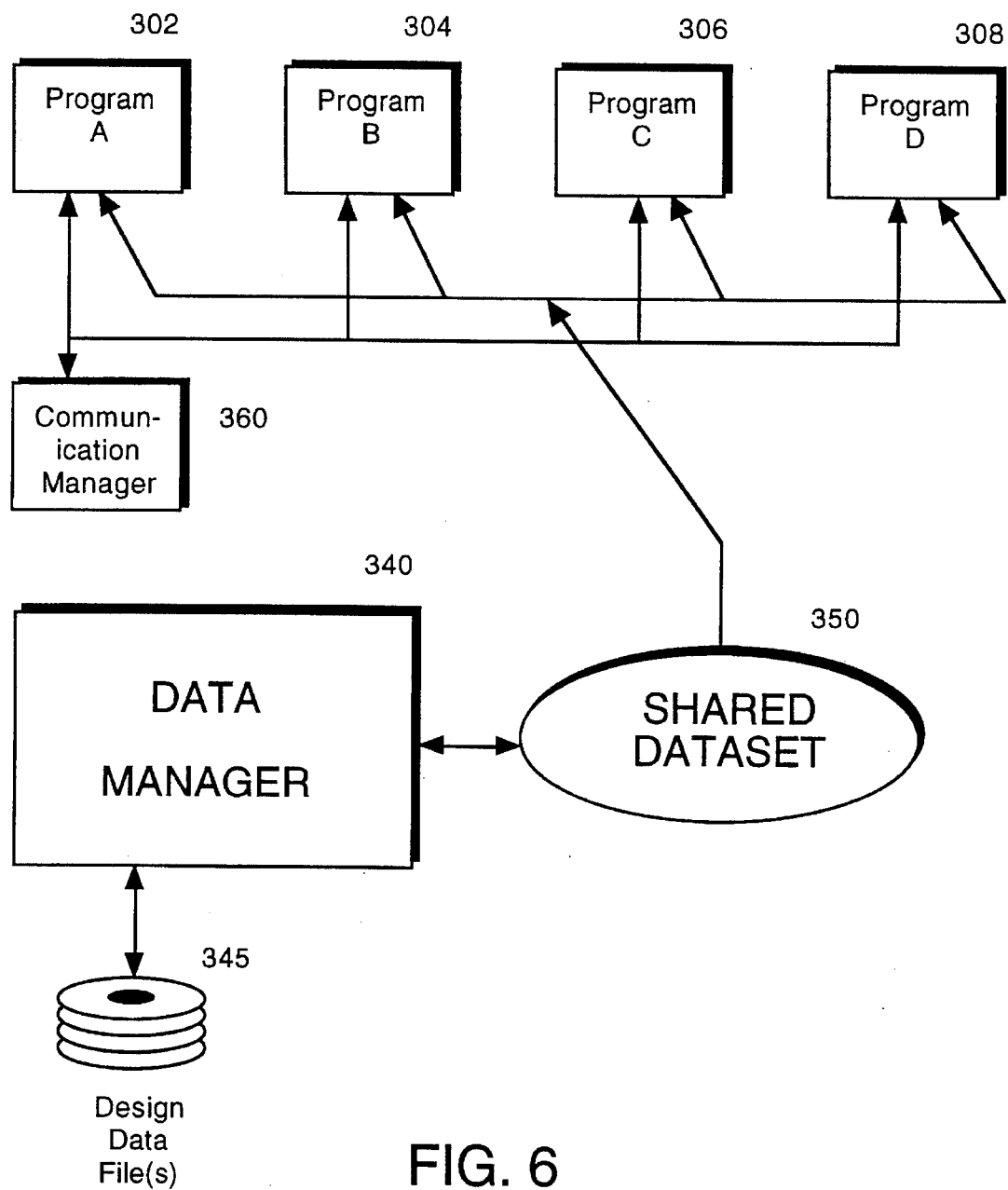
FIG. 6 is a data flow diagram showing the operation of the data manager of the present invention.

Referring to FIG. 6, the data manager 340 has complete control of and governs access rights to a shared dataset 350. In the preferred embodiment, the shared dataset is implemented in the form of a shared memory structure, however, the shared dataset may be accessed over a network, communication line, or from a disk without loss of generality.

In the preferred embodiment, design data files reside on a mass storage device 345, until initial identification of a design to be examined, processed or modified. At this point, the data manager retrieves design data files from the mass storage device 345 and places at least those portions of the design data requiring access by multiple programs into the shared dataset 350. Programs 302, 304, 306, and 308 may now request and receive "read" access rights to the shared dataset or a portion thereof from data manager 340 via the communication manager 360. These programs (302, 304, 306, 308) are representative of any design tools running on the ECAD system of the present invention and may include such functions as a schematic editor, a batch compiler, an incremental compiler, a batch linker, an incremental linker, a logic simulator, a layout floorplanner, a signal routing tool, etc. If a program 302, 304, 306, or 308 needs to modify a portion of the shared dataset 350, it notifies the data manager 340, which then notifies all programs currently having "read" access rights to that same portion of shared dataset 350 that "read" access rights are being removed. Once all of the accessing programs have responded by signifying their compliance with the data manager's request to stop accessing that portion of the shared dataset, then the dataset may be updated, either under the control of data manager 340 or directly by the program requesting the modification, depending upon which type of access was requested.

For the following discussion, consider the case where Programs A, B, and C (302, 304, and 306, respectively) are running and have read-only access to the shared dataset 350, after which Program D (308) starts up and requests access to the shared dataset 350. After Program D is running, Program B makes a change to a portion of the shared dataset 350 which Program B and Program D use in common.

When Program D is started, it requests (via the communication manager 360) and is given read-only access to shared dataset 350 by the data manager (340). Persistent messages (365) from the communication system inform the program of the availability of data and provide a pointer to it. The program may then use the data in a read-only mode until it is informed by the data manager that the data is going to change. This occurs because Program B modifies a portion of the design in common use with Program D. Program B notifies the data manager 340 of the impending change and passes the data manager a request. After receiving notification from data manager 340, the Program D first takes whatever steps are necessary to remove its reliance on the shared data structure. Typically, this involves duplicating the data in question in a local buffer. The program 308 then sends a message to the data manager 340 that it has stopped accessing shared dataset 350. When all programs accessing the same portion of shared dataset 350 have responded that they have ceased accessing that portion of the shared dataset 350, Program B sends a message via the communication manager containing either a list of changes to the shared dataset 350, or a pointer by which the changes may be accessed. The data manager 340 receives this message, modifies the shared dataset 350, and sends messages granting read-only access to all programs which had access to the shared dataset 350 before the change process began, as well to as any Programs which requested access to shared dataset 350 while the changes were being processed.

When Program D re-accesses the shared data structure, it assumes that only the starting location of the data is unchanged, and it re-processes the data. This process of data structure change may repeat many times during the time while a program is active.

In some situations, it may be desirable for programs to have local data tied to the shared data structure. Where such tying is desired, the shared data structure will contain index values which may be used by the program to access a local array which contains either the local data or a pointer to it. This local data may need to be recalculated after each change to the shared data structure. From the viewpoint of the data manager 340, programs A, B, C, and D (302, 304, 306, and 308, respectively) have read-only access to the shared dataset 350 at all times except when the data manager 340 has requested and received write access. As soon as the data manager learns of the intent to open a new design and determines the name of the new design (by means of a message from the tool manager), it loads the shared dataset and sends a persistent message via the communications manager to notify all active programs.

The data manager 340 learns of a change in a portion of the shared design dataset 350 by a message from one of the programs, 302, 304, 306, or 308, via the communication manager. The data manager then sends a message announcing the impending change. The data manager knows which programs have access to that portion of the shared dataset 350 by virtue of their requests for read-only access. When all of the programs accessing the affected data structure have sent messages releasing the shared data, the data manager begins the change either by granting write access to the program requesting the change and allowing it to modify the shared dataset or by accepting a description of the changes to be made from the program requesting the change and instituting those changes itself by modifying the shared dataset according to the description. Upon completion of the change the data manager notifies all programs that previously were accessing the shared dataset that read-only access may be re-established, and that the affected portion of the shared dataset must be re-read and operated upon.

Upon request, the data manager can make any changes made to the shared dataset permanent by saving them to mass storage device 345.

Tool Manager (330)

Referring again to FIG. 3, the tool manager 330 interacts with an operating environment 300 comprising a user interface system 300a and operating system 300b; and with programs A, B, C, and D (302, 304, 306, and 308) via the communication manager 360. Programs A, B, C, and D (302, 304, 306, and 308, respectively) are representative of any design tools running on the ECAD system of the present invention and may include such functions as a schematic editor, a logic simulator, a layout floorplanner, a signal routing tool, etc. Additionally, there are an incremental compiler 320 and an incremental linker 325. In the preferred embodiment, all of the aforementioned programs are included. In another embodiment, the functions of incremental compiler 320 and incremental linker 325 may be combined into a single compiler/linker program. Such software tools are known, and will not be elaborated upon herein except where they differ significantly from existing software tools of the same type. The tool manager 330 also has access to a command history file 332 which contains a complete history of all commands to programs issued by the ECAD system user or by the tool manager 330. The designer interfaces with ECAD system of the present invention by means of display device or devices 305 and manual input device or devices 310. In the preferred embodiment, display device 305 is a color graphic display system and manual input devices 310 are a keyboard and mouse. Also in the preferred embodiment, the two parts of operating environment 300, user interface 300a and operating system 300b, are provided a standard user interface such as XWINDOWS, and a standard operating system such as UNIX.

The tool manager 330 can be used by the designer in three different ways:

1) It may be used in a batch mode whereby the designer makes a design modification and the tool manager 330 completely processes the modification by invoking programs as necessary to modify and update the shared dataset and produce the desired outputs;
2) It may be used in an interactive mode, similar to the batch mode, where commands are recommended to the designer via the user interface for his approval or modification before execution, or
3) It may be ignored entirely and the designer may run programs manually.

In the batch mode, the tool manager 330 issues a series of commands to programs 302, 304, 306, and 308 to achieve a goal selected by the user according to a pre-defined set of rules contained in the rule set 334.

In the interactive mode, the tool manager 330 operates in much the same way, but instead of simply operating immediately upon its rule-based command determinations, it searches command history file 332 for precedent in similar situations and lists several possible commands and their options to the designer via the user interface who may then modify the suggestions before authorizing the command to execute. In actual usage, because of the concurrent nature of the system, both batch and interactive modes may be operating at the same time.

The key to the success of the tool manager's interactive mode is correctly picking the desired next command a majority of the time. Because designs and designers differ, the system must adapt to the current situation. However, the system must give a reasonable suggestion to any situation. Therefore, the following approach (algorithm) is used for next command generation:

1) Use the command history file 332 to determine the next command.
2) If the design history 332 does not provide a clear answer, then use the rule set 334 to determine the next command.

The previous command, its options, and the existence of key files provide a state vector for the design. Each term of the state vector can be assigned a weight in the rule set 334. The tool manager 330 then analyzes the history file, computing the value of the match between the present state vector and previous entries in the history file, summing the assigned weights of the matching terms for each previous entry. The suggested command is the next command after the state with the best match as determined by the highest value. If no previous state is found whose value exceeds a predetermined threshold, the search of the history file fails and the next command is determined from the rule set 334.

This approach tracks changes in design style. Recent history will be favored over old history so that each change in procedure must occur only once for the system to learn the new procedure. If a designer wishes the tool manager 330 to begin with certain suggestions on new designs which have no history, he may modify the suggestion rule set 334.

Suggested options are computed by a combination of the option on the current command, the option on the next command from the history file and the rule set 334.

Performance considerations dictate how the tool manager 330 must access the history file. The history file on disk cannot be accessed for each command suggestion. On the other hand, the entire history file cannot be kept in memory. Therefore, an in-memory database is constructed which contains only the necessary information for the unique states in condensed form. Duplicate states and design information which is not needed in the matching process is discarded and the remaining information is compressed into binary format.

The tool manager's batch mode operation is controlled by looking at a list of design modules which comprise the design in conjunction with rule set 334. The dependencies between files and those commands which are necessary to create the design derived from this. The rule set 334 tells the tool manager 330 how to deal with exceptions when the command issued from tool manager causes an error condition.

A detailed discussion of the tool manager's operation may be found in a document entitled MDE90 Tool Manager Spec., by Yiren Wang, dated Apr. 6, 1990.

It should be understood that the function of the tool manager, inasmuch as it has access to several programs (A, B, C, D), can be partitioned into two or more parts, depending upon the complexity and disparity of the functions (programs) it is interacting with.

Incremental Compilation and Linking

In the preferred embodiment of the technique of the present invention, the increment of compilation change is a "module". The system provides a capability of a "MAKE" function, which examines MAKE file 336, the existence and revision level of design data files 345, and the status of shared dataset 350 to determine which module or modules in the design have changed and need re-compilation and re-linking. When the designer commands the system to update the shared dataset 350, a MAKE function will identify those modules which have changed since the last update. These modules will then be compiled. To save time, this compilation takes place while the data manager is waiting for write access to the shared memory. The determination of which modules have changed may be accomplished by checking the date and time on the design files for the module.

After write access to shared dataset 350 is obtained and all the changed modules are re-compiled, the changed modules are incrementally linked into the shared dataset 350. This is done in two steps. First, old modules are removed from the data structure; then the newly compiled modules are linked into the data structure. Finally, after the data changes are complete, the programs are allowed to re-access the data structure.

The technique of incremental linking is accomplished by establishing a set of incremental change messages which may be sent to an incremental linker which acts upon these commands, altering the design dataset rather than re-creating it. In a preferred embodiment of the incremental linker of the present invention, there are eight types of such change messages: add component, delete component, add net, delete net, add pin, delete pin, add connection and delete connection.

Key features of the present invention are: incremental linking and attached shared data structures, as described hereinabove.

What is claimed is:

1. An Electronic Computer Aided Design (ECAD) system comprising:
one or more computer workstations, data items stored in said computer workstations, and software executing upon said computer workstations; said computer workstations each including: a computer having a memory, means for graphical display of information stored in said computer workstation, means for receiving input from a user into said computer workstation, and means for sharing data between simultaneously active programs operating in said computer workstation;
said data items including:
one or more sets of design files;
a shared dataset resident in said means for sharing data;
a set of rules for determining next actions by analyzing a state vector created by previous actions; and
a command history buffer; said software including:
an operating system;
a graphical user interface;
a plurality of application programs sharing said shared dataset;
means for recording all commands issued to said application programs;
an incremental compiler communicative with said operating system;
an incremental linker communicative with said operating system;
a communication manager communicative with said incremental compiler and with said incremental linker, including means for a message sending program to identify a message being sent by said message sending program as being associated with one of a plurality of predetermined message classes by tagging said message with a message class;
means for a message receiving program to register requests to receive only messages associated with one of a subset of said plurality of predetermined message classes;
means for communicating messages between programs executing on said workstation such that each message is identified by a sending program as being associated with one of said plurality of message classes, and such that each such identified message may be made available to any and all message receiving programs, and such that said message receiving program may receive only those messages identified as being associated with one of said subset of said plurality of predetermined message classes for which it has registered a request to receive; and
means for storing messages identified as requiring permanent storage by the sender of the message;
a data manager communicative with said communications manager, further comprising:
means for loading said shared dataset with data items available for common use by one or more of said application programs;
means for granting and revoking read-only access privileges to said shared dataset to application programs requesting access privilege of said privilege granting and revoking means; and
means for requesting write access to said shared dataset from said access granting and revoking means, such that said access granting and revoking means will revoke read-only access rights to said shared dataset from said application programs which had previously requested and been granted read-only access to said shared dataset, and will permit write access to said shared dataset to the requester, and such that when said write access has been completed, said access granting and revoking means will revoke write access privileges and will restore read-only access privileges to those programs which were shut down to accomplish said write access, as well as any application programs which requested read-only access while said write access was in progress;
a tool manager communicative with said communications manager and with said operating system including:

means for generating commands to application programs;

means for creating a state-vector having components comprising the last issued command, the existence of specific data items, and the revision level of other specific data items, and for storing said state vector as part of a history file in said command history buffer;

means for determining a next action by examining said history file for prior occurrences of state vectors similar to the present state vector by assigning a weight to each term of a state vector, computing the value of the match between the present state vector and said prior occurrences, summing the assigned weights of the matching terms for each previous entry and determining the command suggested as the next command after the state with the best match as determined by the highest value exceeding a predetermined threshold, or if examination of said history file does not produce similar prior state vectors, computing a next action according to said set of rules; and means for executing said next action by generating commands to application programs.

2. An ECAD system according to claim 1, wherein:

said user interface means are implemented in a windowed environment such that multiple program outputs may be viewed simultaneously.

3. An ECAD system according to claim 1, wherein:

said tool manager may be operated without user intervention in a completely automatic mode such that said action is executed unconditionally.

4. An ECAD system according to claim 1, wherein:

said tool manager will communicate to the user via said user interface a list of probable next actions, such that the user may either select one of the listed command and execute it or modify it and execute it.

5. An ECAD system according to claim 1, wherein:

said means for sharing data comprises shared memory.

6. An ECAD system according to claim 1, wherein:

said means for sharing data comprises an on-line mass-storage device.

7. An ECAD system according to claim 1, wherein:

said means for sharing data comprises a remote dataset accessed over a communication link.

8. An ECAD system according to claim 1, wherein:

one or more of said application programs maintains a local dataset which is tied to said shared dataset by parallel arrays using common implicit indices.

* * * * *